United States Patent [19]

Kummer et al.

[11] Patent Number: 5,324,410
[45] Date of Patent: Jun. 28, 1994

[54] DEVICE FOR ONE-SIDED ETCHING OF A SEMICONDUCTOR WAFER

[75] Inventors: Nils Kummer, Ludwigsburg; Jiri Marek; Martin Willmann, both of Reutlingen; Guenther Findler, Stuttgart, all of Fed. Rep. of Germany

[73] Assignee: Robert Bosch GmbH, Stuttgart, Fed. Rep. of Germany

[21] Appl. No.: 969,235

[22] PCT Filed: Jul. 2, 1991

[86] PCT No.: PCT/DE91/00545
§ 371 Date: Feb. 1, 1993
§ 102(e) Date: Feb. 1, 1993

[87] PCT Pub. No.: WO92/02948
PCT Pub. Date: Feb. 20, 1992

[30] Foreign Application Priority Data

Aug. 2, 1990 [DE] Fed. Rep. of Germany ....... 4024576

[51] Int. Cl.⁵ .................. C25D 17/06; C25F 7/00
[52] U.S. Cl. ................... 204/279; 204/297 R
[58] Field of Search .......... 204/224 R, 297 R, 297 W, 204/297 M, 224 M, 279; 205/133

[56] References Cited

U.S. PATENT DOCUMENTS 4,043,894  8/1977  Gibbs ............... 204/297 W
4,696,729  9/1987  Santini ............. 204/297 R X
5,126,031  6/1992  Gordon et al. ..... 204/284 X

FOREIGN PATENT DOCUMENTS 1257730A  9/1986  U.S.S.R. .

OTHER PUBLICATIONS

Kaminsky, "Micromachining of Silicon Mechanical Structures", *J. Vac. Sci. Technol.*, vol. 3, No. 4, Jul.-/Aug. 1985, pp. 1015–1024.
Joseph T. Kung et al, "A compact, inexpensive apparatus for one-sided etching in KOH and HF", *Sensors and Actuators*, vol. 29, (1991), pp. 209–215.

*Primary Examiner*—Donald R. Valentine
*Attorney, Agent, or Firm*—Spencer Frank & Schneider

[57] ABSTRACT

A device for one-sided etching of a semiconductor wafer (silicon wafer) is proposed, which consists in the manner of an etching box of a trough-shaped basic body (3, 23) and a lid (2, 22) which matches the latter hermetically. The lid (2, 22) has on the topside an opening (5, 25) for the passage of the etching liquid. The etching box bears at least two O-rings (7, 8, 27, 28), of which one is arranged centrally in the basic body (3, 23) and the other centrally in the lid (2, 22). The wafer (1) is clamped between the O-rings (7, 8, 27, 28). A wire (10) connected to the wafer by means of a plate of a spring contact (11, 41) is guided out of the etching box through a bore (4) extending through the basic body (3, 23).

19 Claims, 2 Drawing Sheets

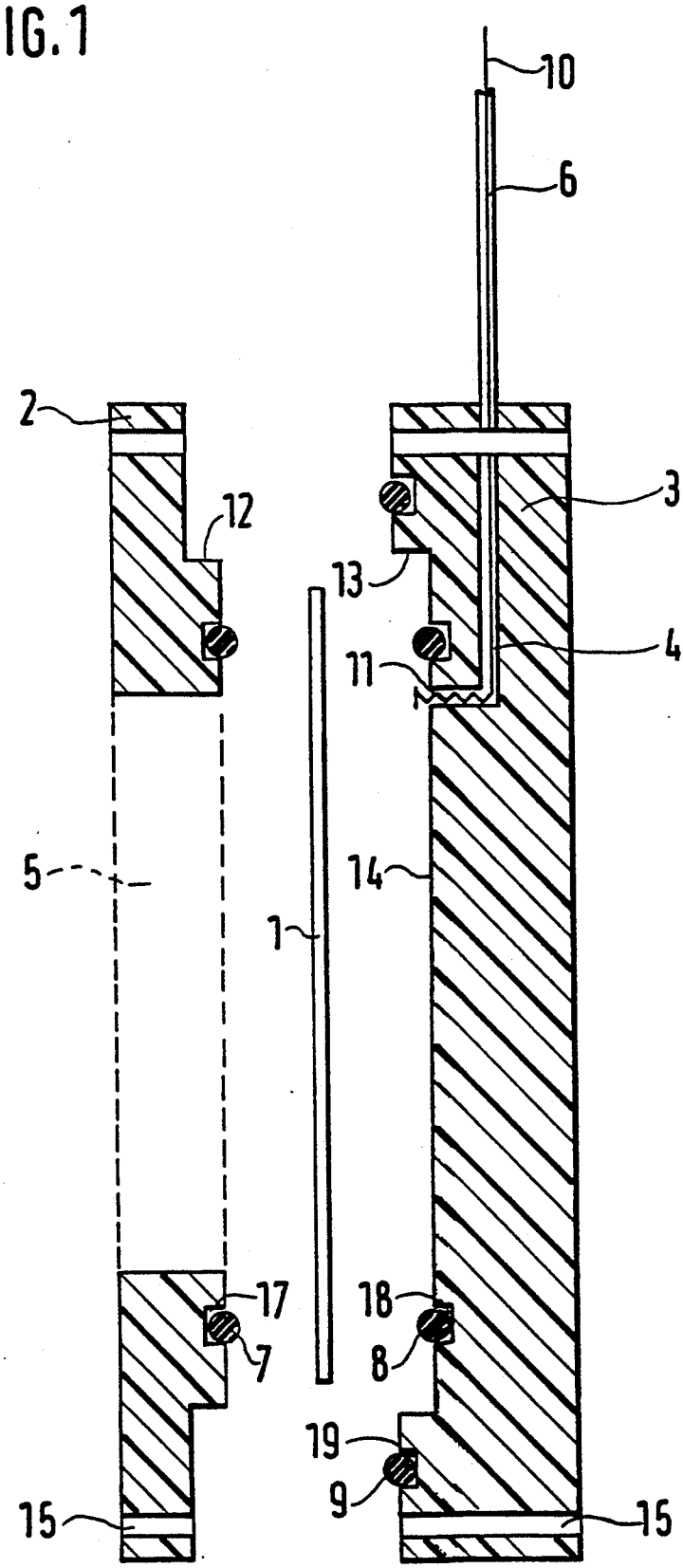

DEVICE FOR ONE-SIDED ETCHING OF A SEMICONDUCTOR WAFER

PRIOR ART

The invention relates to a device for one-sided etching of semiconductor wafers (silicon wafers), which is constructed like an etching box. Such a device is known from the journal Vacuum Science Technology, issue of July/August 1985, pages 1015 ff., G. Kaminsky, "Micro-machining of silicon mechanical structures". Described therein is an etching mount for silicon wafers in the form of a Teflon plate at the edge of which there is arranged in a groove a O-ring on which the wafer to be etched is supported. The wafer is mounted on the Teflon plate by a ring made from Teflon, which is connected to the base plate by means of nylon screws. Etching solution reaches the surface of the wafer through the Teflon ring. The O-ring prevents etching solution from reaching the rear. However, the etching solution can wet the edge of the wafer on both sides up to the contact zone between the wafer and 0-ring. The mechanical stability is therefore diminished in the edge region of the wafer, and in addition possibilities for machining the wafer after the etching process are restricted. During the etching operation, the pressure of the air situated under the wafer rises as a consequence of the high etching temperatures. The risk of breakage therefore increases, particularly at the edge region of the wafer, where it rests on the O-ring. A device for pressure compensation for the air space produced under the wafer is not provided. Again, the possibility of electrical contacting of the wafer in order to be able to carry out an electrochemical etching stop is not provided.

Furthermore, as basic material, Teflon has a dimensional stability which is too low at high etching temperatures for the envisaged application. In solutions, Teflon varies its volume by swelling, and thus its shape. An etching mount made from Teflon therefore cannot be multiply used.

It is the object of the invention to specify a device for the one-sided etching of silicon wafers which imposes a low mechanical stress on the wafer to be etched, ensures complete protection of the wafer edges, and permits an electrochemical etching stop.

The object is achieved according to the invention by the characterising features of claim 1. In this case, use is made of a mount like an etching box having an open upper part which is provided with two O-rings between which the wafer is clamped and which are arranged such that the etching solution can reach only the inner region, situated inside the O-ring, which is on the lid side, of the side of the wafer to be etched. The cavity produced under the wafer backside is connected to the external environment via a bore which adjoins a tube or a hose. The production of an overpressure under the wafer is thereby excluded. Guided simultaneously through the bore is the lead for the electrical contacting of the wafer which is required for the electrochemical etching stop.

ADVANTAGES OF THE INVENTION

The device according to the invention has the advantage that the wafer edge is protected absolutely securely against contact with the etching solution. The O-rings holding the wafer are arranged precisely one above the other, so that both sides of the wafer are subjected to symmetrical holding forces. Due to the fact that it is mounted only via O-rings, the wafer is elastically supported. It is contacted electrically from the backside in a manner protected against the etching solution. Even at high temperatures of the etching solution, no overpressure is produced in the cavity under the wafer backside because of the connection to the external environment. The device therefore permits maximum safety against breakage. The good dimensional stability of the materials proposed permits multiple use of the etching box. The electrical contacting of the wafer is advantageously performed by spring contacts.

Further advantageous developments of the device follow from the measures specified in the subclaims.

When producing the etching box from a polyvinylidene fluoride (PVDF) plastic, it is expedient respectively to provide in the lid and base part grooves which fix the O-rings. Since the O-rings swell due to the contact with the etching solution, the volume of the grooves is dimensioned such that the pressure on the wafer remains constant. In the contact region between the lid and base part, it is expedient to provide a third O-ring in order to achieve additional security that no etching solution can penetrate into the edge region. It is advantageous to use a spring-loaded pin for the electrical contacting of the wafer backside.

In another advantageous embodiment, the etching box is derived from a polypropylene (PP) transport box available commercially. An etching box fabricated in this way is of milky transparency and permits any leaks of the etching box to be detected immediately from outside. Furthermore, such an etching box consisting of PP is exceptionally cost-effective. It is expedient to introduce silicone paste as an additional seal into the contact region between the lid and base part. A spring part in the basic body permits reliable electrical contacting of the wafer backside and quick insertion and removal of the wafer.

Two exemplary embodiments of the invention are explained in more detail with the aid of drawings and the following description.

DRAWING

FIG. 1 shows a section of an etching box fabricated from PVDF, and

DESCRIPTION

Figure 2A:
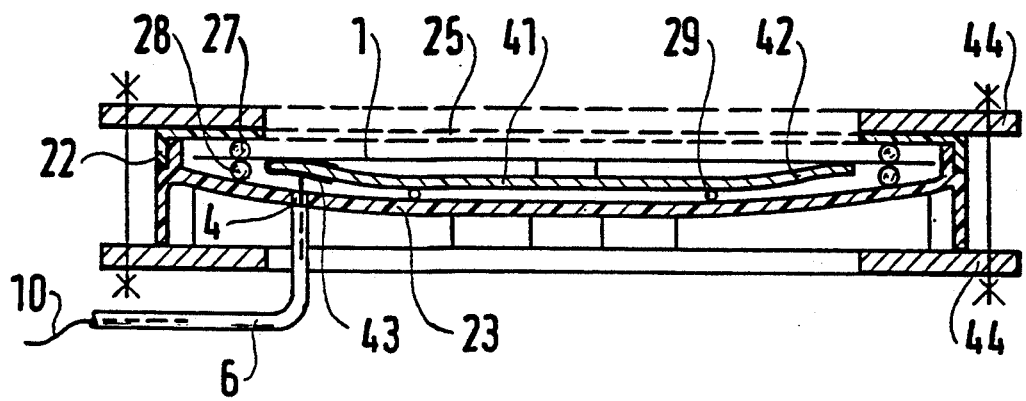
FIGS. 2a and 2b show sections of a PP etching box.

The first exemplary embodiment, shown in FIG. 1, consists of the basic body 3 and lid 2 as main parts. The two parts are fabricated from the plastic PVDF. The material is dimensionally stable even at high temperatures, and permits multiple use of the etching box. The entire etching box, formed from the lid 2 and basic body 3, preferably has a round shape, although other shapes are also possible. The lid 2 and basic body 3 are configured with a shape such that they match one another. For this purpose, the edge of the lid 2 is lowered in the shape of a step with respect to the inner region 12, while the edge of the basic body 3 is raised in the shape of a step. The steps are configured such that when the etching box is closed with the wafer situated therein the edge regions of the lid 2 and of the basic body 3 lie flush against one another, the O-rings 7, 8, between which the wafer 1 is clamped, being squeezed by approximately 20% of its cord thickness. The diameter of the depression on the inner region 13, or of the elevation on the inner region 12 are somewhat larger than the diameter of the wafer 1, for which the etching box is designed. The basic body 3 advantageously has two concentric grooves 18 and 19, of which one is worked into the edge region elevated in the shape of a step, while the other is worked in on the edge of the inner region 13. An O-ring 8, 9 is situated respectively in the grooves 18, 19. The basic body surface 14 situated inside the inner O-ring 8 is connected to the outside of the basic body via a bore 4 whose diameter is expediently 0.1–5 mm. Immediately adjoining the outlet of the bore 4 on the outside of the basic body is a small tube 6 or a hose, which continues the bore 4. On the one hand, the pressure compensation between the environment and the space surrounded by the wafer 1, O-ring 8 and basic body surface 14 is performed through the bore 4. On the other hand, the wire 10 required for the electrical contacting of the wafer 1 is guided to the outside through the bore 4. The bore 4 expediently extends at right angles from the inner surface to the narrow lateral outer surface of the basic body. Due to the rectangular guidance, the etching box can conveniently be introduced into the etching solution vertically. For this purpose, the bore 4 is continued at its outlet in the form of an adjoining straight small tube 6 or hose which projects from the etching solution. Of course, other ways of guiding the bore 4 are equally valid. A spring-loaded contact 11 which ensures reliable electrical contacting of the wafer 1 is attached to the inner basic body surface 14 at the end of the wire 10 guided through the bore 4. In the inner region 12, which is elevated with respect to the edge, the etching box lid 2 has a groove 17 which is constructed such that it is situated precisely over the inner groove 18 of the basic body when the etching box is closed. A further O-ring 7 is arranged in the groove.

The outer O-ring 9 in the basic body 3 and the O-ring 7 placed in the lid 2 are each exposed from one side to the etching solution during the etching process, as a result of which they swell slightly. This can lead to an elevated pressure on the wafer clamped between the O-rings 7 and 8. The form of the grooves 17 to 19 which fix the O-rings 7 to 9 is therefore expediently configured such that an enlargement in volume of the O-rings 7 to 9 due to swelling is absorbed by the grooves 17 to 19, and the pressure on the wafer 1 thereby remains approximately constant at any time.

The lid 2 and basic body 3 of the etching box are held together by screws which are inserted through bores 15 arranged for this purpose on the edges of the lid and basic body. Alternatively, connecting the lid and basic body can also be performed by quick-action fasteners. It is necessary in this case to take measures on the topside of the lid and the underside of the basic body to fix the quick-action clamps. The pressure with which the etching box parts are pressed together is to be selected such that the stepped edges of the lid 2 and basic body 3 lie fixedly against one another, the O-rings 7 and 9, which are visible from outside, being pressed virtually completely into the grooves 17 and 19, respectively.

For the purpose of applying the etching box, the wafer 1 is placed into the basic body 3 onto the inner O-ring 8 arranged therein. The side to be protected points towards the basic body surface 14. The lid 2 is subsequently put on and connected to the basic body 3 by tightening the screws. The sealed etching box can be exposed to the etching solution in any way. In particular, the duration and temperature of the etching process can be freely selected, since it is ensured by the pressure-compensating bore 4 that no overpressure, and thus no risk of breakage, can be produced in the cavity provided under the wafer 1.

Figure 2B:
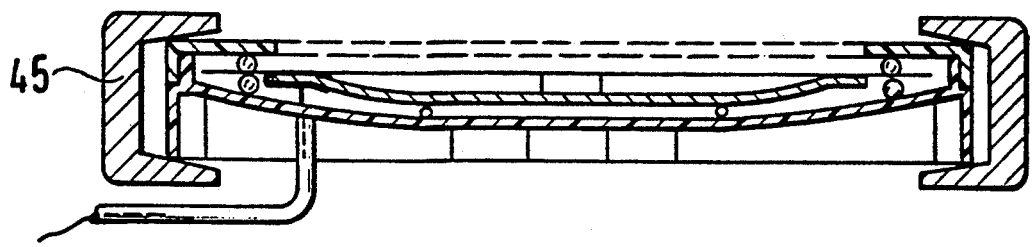

A second exemplary embodiment is shown by FIGS. 2a and 2b. Parts corresponding to the first exemplary embodiment are provided with the same reference numerals.

The exemplary embodiment shown in FIG. 2a consists, as the main parts, of the lid 22 and basic body 23, as well as two pressure rings 44. The basic body 23 is the lower part of a commercial wafer transport box such as is available, for example, from the FLUOROWARE company. The etching box consists of polypropylene (PP), a material which has a good dimensional stability even at high etching temperatures and is very cost-effective. Situated in the slightly conical base trough of the basic body 23 is an O-ring 28, which is inserted loosely centrally and whose diameter is approximately 4/5 of the etching box diameter, as well as a cruciform spring part 41 which is arranged inside the O-ring 28 and is likewise available commercially. One of the four resilient tongues 42 of the spring part 41 is sheathed by an electrically conductive plate 43 with a thickness of approximately 0.05 mm. On the one hand, when the etching box is closed the spring part 41 stabilises the wafer 1, which is to be etched, in the central region, and on the other hand the tongue 42 which is sheathed by a plate serves the purpose of the electrical contacting of the wafer backside. Said spring part can be fixedly connected to the basic body 3 or loosely inserted. In the latter case, it is expedient to provide a bearing for the spring part 41, for example in the form of a ring 29. Soldered to the metal plate 43 is a wire 10 made from platinum, which is guided out of the basic body through a bore 4 placed in the base trough of the basic body 23. Adjoining the bore 4 in a hermetically sealed fashion on the outside of the base trough is a small tube 6 or a hose or the like, which projects from the etching solution and in which the contacting wire 10 is guided out of the etching solution. The lid 22 is derived from the upper part of the transport box, which belongs in standard fashion to the basic body 23. Turned into the topside is a circular opening 25 through which the etching solution can pass. Its diameter is expediently 60 to 70% of the entire etching box diameter, for example 70–80 mm in the case of an etching box provided for four-inch wafers.

In order to apply the etching box, the wafer 1 is placed with the side to be etched upwards into the basic body 23 onto the O-ring 28 arranged therein. The spring part 41, which is a spring cross, for example, effects the electrical contacting of the wafer 1 by pressing lightly against the wafer backside on the underside. A second O-ring 27, which is concentrically aligned, is placed onto the upward pointing wafer side. The second O-ring 27 has the same diameter as the ring in the basic body 23. The cross-sections of the two O-rings 27, 28 are dimensioned such that the wafer 1 clamped between the O-rings 27, 28 are supported fixedly and in a nonslip fashion when the etching box is closed. A slight swelling of the O-rings 27, 28 does not change the contact pressure on the wafer 1. The lid 22 is subsequently put onto the basic body 23, pasty silicone being applied to the sealing surface 37 between the lid 22 and basic body 23 in order to improve the tightness. Another possibility of achieving a good seal consists in configuring the sealing surfaces 37 between the basic body 23 and lid 22 in a conical fashion, so that they lie locked against one another by being pressed together. As is represented in FIG. 2b, the lid 22 and basic body 23 of the etching box are held together externally by quick-action fasteners 43 in the form of clamp fasteners. They are expediently fixedly connected to one of the pressure rings 44, and are fixed to the other by suitable devices.

Alternatively, the etching box consisting of the lid 22 and basic body 23 is held together by two pressure rings 44 made from an acid-resisting material such as, for example, hard plastic, by being clamped between the rings 44. For their part, the pressure rings 44 are pressed against one another by means of screws. The pressure rings are provided in this case with bores through which the screws are inserted.

We claim:

1. An etching box type device for one-sided etching of a semiconductor wafer, said device comprising a trough-shaped basic body; a lid hermetically sealing said basic body, said lid having an opening to allow etching fluid to pass therethrough; at least two superposed O-rings between which the wafer to be etched may be clamped, one of said O-rings being concentric with said basic body and the other of said O-rings being concentric with said lid, said basic body having a bore which connects the surface of said basic body that lies within said one O-ring with the exterior of said basic body; and a wire, connected to an electrical spring contact for contacting a wafer clamped between said O-rings, passing through said bore to the exterior of the etching box.

2. Device according to claim 1, characterised in that at least two O-rings (7, 8, 27, 28) have the same diameter.

3. Device according to claim 1, characterised in that adjoining the outlet of the bore (4) is a small tube (6), a hose or the like which continues the bore and leads out of the etching solution.

4. Device according to claim 3, characterised in that the small tube (6) or the hose are produced from polypropylene (PP) or polyvinylidene fluoride (PVDF) plastic.

5. Device according to claim 1, characterised in that the lid (2) and basic body (3) are produced from PVDF plastic.

6. Device according to claim 1, characterised in that the inner region (12) of the underside of the lid is constructed elevated in the shape of a step and the inner region (13) of the topside of the basic body is constructed depressed in the shape of a step, and the steps have the same diameter.

7. Device according to claim 1, characterised in that the lid (2) and basic body (3) have grooves (17) and (18), respectively, in which the O-rings (7) and (8), respectively, are arranged protruding.

8. Device according to claim 1, characterised in that the basic body (3) has on the edge elevated with respect to the inner region (13) a further groove (19) in which a further O-ring (9) is arranged.

9. Device according to claim 1, characterised in that the lid (2) has in the edge depressed with respect to the inner region (12) a further groove in which a further O-ring (7) is arranged.

10. Device according to claim 1, characterised in that when the etching box is closed the edge regions of the lid (2) and of the basic body (3) lie flush against one another, with the exertion of a defined contact pressure on the O-rings (7, 8, 9) situated between the lid (2) and basic body (3).

11. Device according to claim 1, characterised in that the spring contact (11) is constructed as a spring-loaded pin projecting from the bore (4).

12. Device according to claim 1, characterised in that the grooves (17) to (19) are configured such that they can absorb the volume of the O-rings (7) to (9) which is changed due to swelling and/or pressing, and the compressive forces transmitted via the O-rings (7) to (9) remain approximately constant.

13. Device according to claim 1, characterised in that the lid (22) and basic body (33) of the etching box are produced from PP.

14. Device according to claim 1, characterised in that the O-ring (8) lies loosely in the basic body (3).

15. Device according to claim 1, characterised in that the O-ring (27) on the lid side lies loosely between the lid (2) and wafer topside.

16. Device according to claim 1, characterised in that a spring cross (41) which supports the wafer (1) is arranged in the basic body (23).

17. Device according to claim 15, characterised in that at least one of the tongues (42) of the spring cross (41) consists of electrically conductive material or is sheathed in an electrically conductive material.

18. Device according to claim 16, characterised in that the wire (10) for the electrical contacting of the wafer (1) is connected to the tongue (42) of the spring cross (41).

19. Device according to claim 16, characterised in that the wire (10) and/or the conductive sheath (43) of the tongue (42) of the spring cross (41) are made from platinum.

* * * * *